United States Patent
Peidous

(10) Patent No.: US 7,432,174 B1
(45) Date of Patent: Oct. 7, 2008

(54) METHODS FOR FABRICATING SEMICONDUCTOR SUBSTRATES WITH SILICON REGIONS HAVING DIFFERENTIAL CRYSTALLOGRAPHIC ORIENTATIONS

(75) Inventor: Igor Peidous, Fishkill, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/693,890

(22) Filed: Mar. 30, 2007

(51) Int. Cl.
*H01L 21/46* (2006.01)

(52) U.S. Cl. .................. 438/459; 438/458; 438/457; 438/455; 438/E21.564

(58) Field of Classification Search ......... 438/458–455, 438/406; 257/E21.564
See application file for complete search history.

(56) References Cited

U.S. PATENT DOCUMENTS

| | | | | |
|---|---|---|---|---|
| 5,681,775 | A * | 10/1997 | Pogge | 438/406 |
| 6,616,854 | B2 * | 9/2003 | Jones et al. | 216/33 |
| 6,821,826 | B1 | 11/2004 | Chan et al. | |
| 2007/0205460 | A1 * | 9/2007 | Chidambarrao | 257/327 |

* cited by examiner

*Primary Examiner*—Dung A. Le
(74) *Attorney, Agent, or Firm*—Ingrassia Fisher & Lorenz, P.C.

(57) ABSTRACT

A method is provided for fabricating a differential semiconductor substrate. A first structure is provided which comprises a first semiconductor substrate including a first semiconductor region, and a first oxide layer overlying a surface of the first semiconductor substrate. The first semiconductor substrate has a first crystallographic orientation. A second structure is provided which includes a second semiconductor substrate comprising a first layer and a second layer, and a second oxide layer which overlies a surface of the first layer. The second semiconductor substrate has a second crystallographic orientation different than the first crystallographic orientation. The first layer includes a second semiconductor region. The first layer and the second oxide layer are removed from the second structure, and assembled to the first semiconductor substrate to form a composite structure. A bonded composite structure is then formed by exposing the composite structure to a temperature adequate to cause bonding of the first oxide layer and the second oxide layer. Portions of the bonded composite structure are removed to expose the first semiconductor region and the second semiconductor region and thereby form the differential semiconductor substrate.

19 Claims, 4 Drawing Sheets

METHODS FOR FABRICATING SEMICONDUCTOR SUBSTRATES WITH SILICON REGIONS HAVING DIFFERENTIAL CRYSTALLOGRAPHIC ORIENTATIONS

TECHNICAL FIELD

The present invention generally relates to semiconductor devices and to methods for their fabrication, and more particularly relates to methods for fabricating semiconductor devices in and on semiconductor substrates having differential crystallographic orientations.

BACKGROUND

A complementary MOS (CMOS) semiconductor device includes an N-channel MOSFET (NMOSFET) device and a P-channel MOSFET (PMOSFET) device which are fabricated on and in a semiconductor substrate. The semiconductor substrate can generally be either a bulk semiconductor substrate or a semiconductor-on-insulator (SOI) substrate. A SOI substrate generally includes at least one thin layer of semiconductor material disposed on or over a buried oxide insulating layer which, in turn, is supported by a carrier wafer so that the buried oxide insulating layer is disposed between the carrier wafer and the semiconductor layer.

The performance of a CMOS semiconductor device can be measured in terms of switching speed and operational frequency which are proportional to the mobility of charge carriers, electrons or holes, in a given CMOS semiconductor device. The mobility of the majority charge carrier depends directly on a crystallographic orientation of the semiconductor substrate in and on which the CMOS semiconductor device is fabricated. For example, the majority carrier in NMOSFET devices are electrons, and the mobility of electrons is best in semiconductor materials having a (100) crystallographic orientation. As such, the optimal crystallographic orientation for NMOSFET devices is (100) since this allows for the highest electron mobility. By contrast, the majority carrier in PMOSFET devices are holes, and the mobility of holes is best in semiconductor materials having a (011) or equivalent crystallographic orientation. Therefore, the optimal crystallographic orientation for PMOSFET devices is (011) or equivalent crystallographic orientation since this allows for the highest hole mobility. The (101) and (011) crystallographic orientations are equivalent to the (011) crystallographic orientation.

To improve performance and speed of CMOS devices, it would be desirable to provide a semiconductor substrate which has one crystallographic surface orientation for PMOSFET devices and another crystallographic surface orientation for NMOSFET devices. One approach for fabricating such a semiconductor substrate begins with a SOI substrate which has a thin silicon layer of a first crystallographic orientation (e.g., a (100) crystallographic orientation), and a silicon carrier wafer which has a second crystallographic orientation (e.g., a (011) crystallographic orientation). A trench is then etched through the thin silicon layer and the buried oxide layer until the carrier wafer is reached. Dielectric spacers are formed on the sidewalls of the trench. A selective epitaxial growth process is then used to selectively grow an epitaxial layer of silicon from the bottom of the trench to fill the trench with epitaxially-grown silicon material. The dielectric spacers prevent epitaxial growth from occurring from at potential nucleating sites on the sidewalls of the trench by covering those potential nucleating sites, and no epitaxial growth occurs on the dielectric spacer material. As a result, the selective epitaxial layer replicates the crystallographic orientation of the carrier wafer along of the bottom surface of the trench, and the selective epitaxial layer will ideally have a second crystallographic orientation that is identical to that of the carrier wafer. In theory, the resulting SOI substrate will have silicon regions with differentially oriented crystallographic surface orientations: one silicon region having a first (100) crystallographic orientation and another silicon region having a second (011) crystallographic orientation.

Unfortunately, this approach suffers from drawbacks which have prevented its use. For example, as the epitaxial layer is grown upwards in the trench from the carrier wafer, the epitaxial layer encounters dielectric spacers which disrupt the epitaxial growth process and cause defects in the crystallographic pattern of the silicon material. As a result, the crystallographic structure of the epitaxial layer does not precisely replicate the crystallographic pattern of the carrier wafer, and the epitaxial layer exhibits a high density of crystal defects as well as facets at the edges of the selective epitaxial layers. The defects in the crystalline structure of the epitaxial layer tend to degrade device performance.

In addition, the process of fabricating the SOI substrate using this approach involves a relatively complex series of steps. For example, to prevent epitaxial growth on the thin silicon layer, a capping layer must be formed on the thin silicon layer before the trenches are formed. An additional dielectric layer is then deposited on top of the capping layer and within the trench. It is used to form the dielectric spacers on the trench sidewalls to ensure that epitaxial growth does not occur at the edges of the thin silicon layer residing near the trench.

Accordingly, it is desirable to provide improved methods for fabricating a semiconductor substrate that includes silicon regions with differentially oriented crystallographic surface orientations. In addition, it is desirable to provide methods for fabricating CMOS devices on such semiconductor substrates. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment, a method is provided for fabricating a differential semiconductor substrate. A first structure is provided which comprises a first semiconductor substrate including a first semiconductor region, and a first oxide layer overlying a surface of the first semiconductor substrate. The first semiconductor substrate has a first crystallographic orientation. A second structure is provided which includes a second semiconductor substrate comprising a first layer and a second layer, and a second oxide layer which overlies a surface of the first layer. The second semiconductor substrate has a second crystallographic orientation different than the first crystallographic orientation. The first layer includes a second semiconductor region. The first layer and the second oxide layer are removed from the second structure, and assembled to the first semiconductor substrate to form a composite structure. A bonded composite structure is then formed by exposing the composite structure to a temperature adequate to cause bonding of the first oxide layer and the second oxide layer. Portions of the bonded composite structure are removed to expose the first semiconductor region and the second semiconductor region and thereby form the differential semiconductor substrate.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
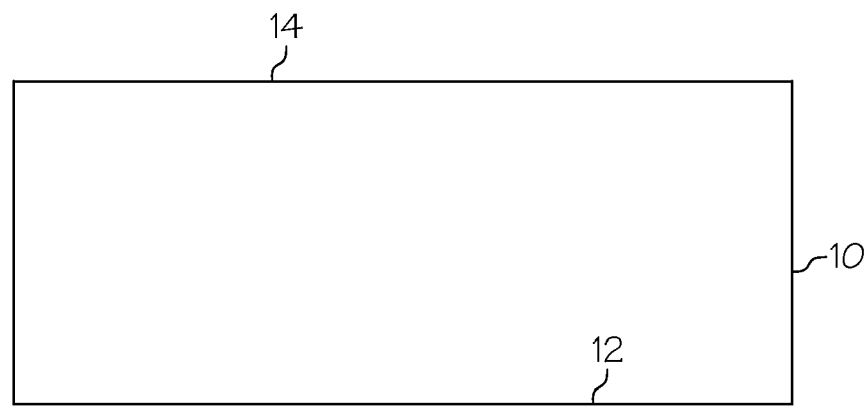
FIGS. 1-9 illustrate, in cross section, a differential semiconductor substrate and method steps for its fabrication in accordance with various embodiments of the invention.

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

As will be described below with reference to FIGS. 1-13, a method is provided for fabricating a differential semiconductor substrate 95 which includes a first device region 135 and a second device region 140. The first device region 135 and the second device region 140 have silicon regions 11, 41, respectively, with different crystallographic orientations. One silicon region has a crystallographic surface orientation that is optimized for mobility of one type of majority charge carrier (e.g., electrons), and the other silicon region has a different crystallographic surface orientation that is optimized for mobility of another type of majority charge carrier (e.g., holes). Because the differential semiconductor substrate 95 includes silicon regions having different crystallographic surface orientations, the differential semiconductor substrate 95 is ideal for fabricating a CMOS device 150, which includes a PMOSFET device and an NMOSFET device, with improved performance and switching speed.

FIGS. 1-9 illustrate, in cross section, a differential semiconductor substrate 95 and method steps for its fabrication in accordance with various embodiments of the invention.

Figure 2:
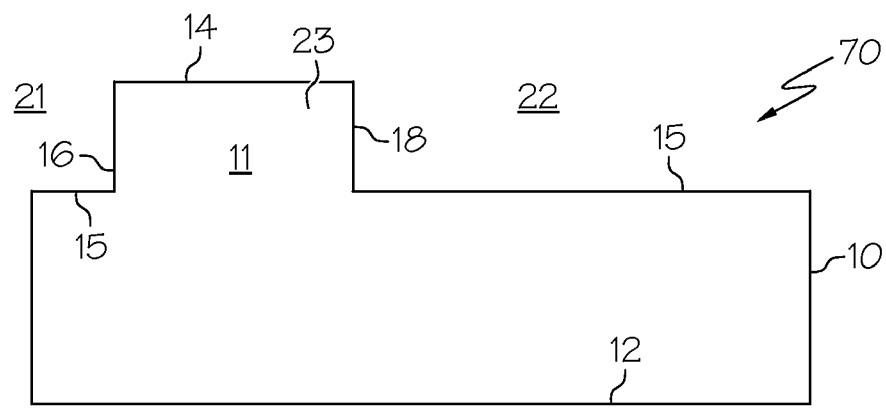
Figure 3:
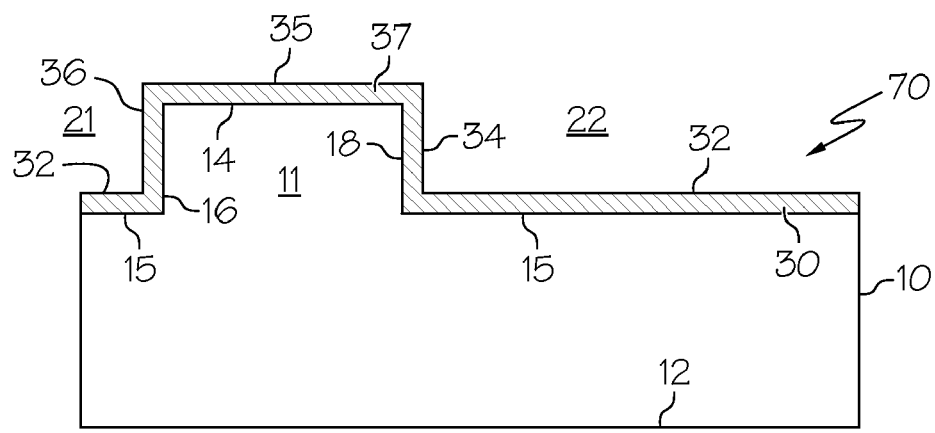

FIGS. 1-3 illustrate, in cross section, a patterned base wafer 70 and method steps for its fabrication in accordance with various embodiments of the invention. As will be described below, the patterned base wafer 70 will eventually be used to fabricate a portion of the differential substrate 95. As illustrated in FIG. 1, the manufacture in accordance with an embodiment of the invention begins with providing a base wafer 10 which comprises a bulk semiconductor wafer having a first crystallographic orientation. The base wafer 10 may also be referred to as a base substrate or base die, handle wafer, a host wafer, or a carrier wafer. In one embodiment illustrated in FIGS. 1-9, the first crystallographic orientation is a (100) crystallographic orientation; however, in other embodiments, the first crystallographic orientation can be a (011) crystallographic orientation. The base wafer 10 includes a lower surface 12 and an upper surface 14. The base wafer 10 may comprise silicon, germanium, a gallium arsenide, or other semiconductor materials. In one embodiment, the base wafer 10 comprises a monocrystalline silicon substrate having a (100) surface crystal orientation. The monocrystalline silicon substrate may comprise a lightly impurity-doped monocrystalline silicon materials as well as silicon admixed with small amounts of other elements such as germanium, carbon, and the like, as well as impurity dopant elements such as boron, phosphorus, and arsenic, to form a substantially monocrystalline semiconductor material.

As illustrated in FIG. 2, the base wafer 10 is patterned along its upper surface 14 by etching trench regions or trenches 21, 22 in the upper surface 14 of the base wafer 10. For example, according to one embodiment, a layer of photosensitive material, such as photoresist, is applied over the base wafer 10, and is patterned to leave a remaining portion and to expose selected portions of the base wafer 10 which correspond to the locations of the trenches 21, 22. The exposed portions of the base wafer 10 are then anisotropically etched away, for example, using a reactive ion etching (RIE) process which uses, for example, a chlorine or hydrogen bromide/oxygen chemistry. After etching is performed, the base wafer 10 is a patterned base wafer 70 which includes at least one mesa structure 23 and trenches 21, 22. The mesa structure 23 includes sidewalls 16, 18 and an upper surface 14. Trenches 21, 22 are defined by sidewalls 16, 18 of the mesa structure 23 and a bottom surface 15 which corresponds to a surface of the base wafer 10 after etching.

As illustrated in FIG. 3, an oxide layer 35 is grown or deposited over the patterned base wafer 70. The oxide layer 35 comprises an upper portion 37, lower portions 32, and sidewall portions 34, 36. The oxide layer 35 can be, for example, an oxide-based material such as silicon dioxide ($SiO_2$). In one embodiment, the oxide layer 35 may be conformally blanket deposited overlying the surface of the patterned base wafer 70, for example, using techniques such as by chemical vapor deposition (CVD) or physical vapor deposition (PVD) to thickness is between approximately 40 nm and 100 nm.

Figure 4:
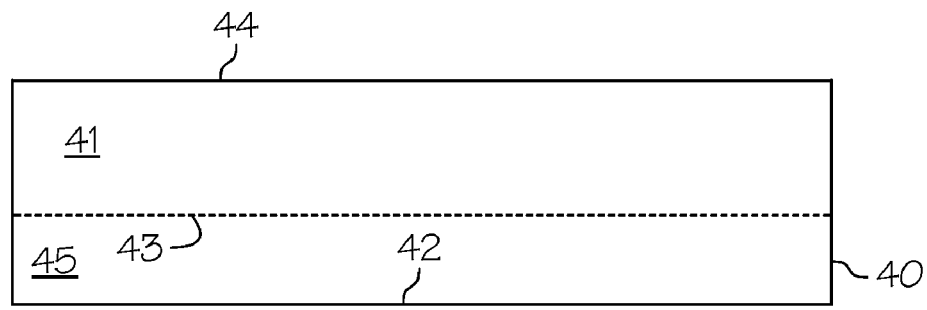
Figure 5:
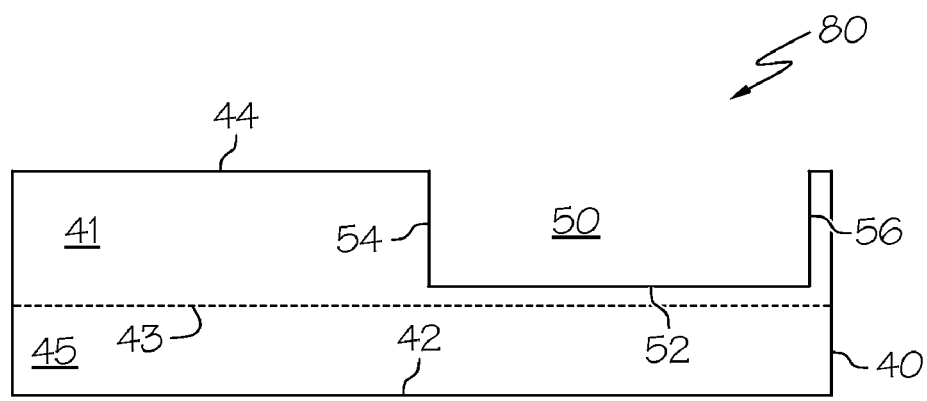
Figure 6:
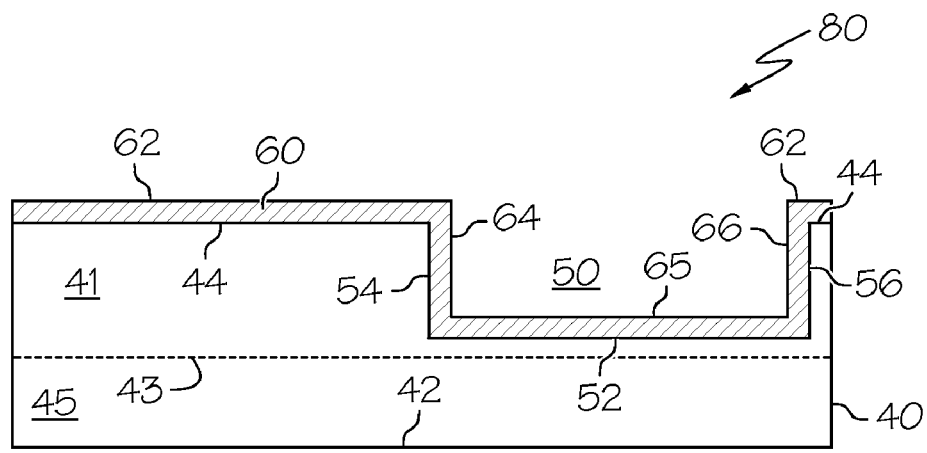

FIGS. 4 through 6 illustrate, in cross section, a patterned donor wafer 80 and method steps for its fabrication in accordance with various embodiments of the invention. As will be described below, the patterned donor wafer 80 will eventually be used to fabricate another portion of the differential substrate 95.

As illustrated in FIG. 4, the fabrication in accordance with an embodiment of the invention begins with providing a donor wafer 40 which comprises a bulk semiconductor wafer having a second crystallographic orientation different that the first crystallographic orientation. The donor wafer 40 may also be referred to as a donor substrate or donor die, a device wafer or donor device wafer. The terms wafer, substrate and die are used interchangeably herein. In one embodiment illustrated in FIGS. 4-9, the second crystallographic orientation can be a (011) crystallographic orientation; however, in other embodiments, the second crystallographic orientation can be a (100) crystallographic orientation.

The donor wafer 40 includes a lower surface 42, an upper surface 44, a transfer layer 41, a carrier layer 45, and a hydrogen interface 43 formed between the transfer layer 41 and the carrier layer 45 The donor wafer 40 may comprise silicon, germanium, a gallium arsenide, or other semiconductor materials. In one embodiment, the donor wafer 40 comprises a monocrystalline silicon substrate having a (011) crystallographic orientation. The monocrystalline silicon substrate may comprise a lightly impurity-doped monocrystalline silicon materials as well as silicon admixed with small amounts of other elements such as germanium, carbon, and the like, as well as impurity dopant elements such as boron, phosphorus, and arsenic, to form a substantially monocrystalline semiconductor material.

In one implementation, the hydrogen interface 43 can be formed in the donor wafer 40 using a well-known smart cut process or an epitaxial layer transfer (ELTRAN) process. When the donor wafer 40 is manufactured using the smart cut process, the hydrogen interface 43 is formed by implanting hydrogen ions into the donor wafer 40 to a depth equal to a desired thickness of the transfer layer 41. As will be described in detail below, the hydrogen interface 43 allows for the transfer layer 41 to be split cleanly from the carrier layer 45 during subsequent processing so that transistors can be formed on a portion of transfer layer 41.

As illustrated in FIG. 5, processing of the donor wafer 40 continues by etching trenches 50 into a portion of the transfer layer 41. The trenches 50 are defined by the bottom surface 52 and sidewalls 54, 56. The trenches 50 can be etched to a depth between 20 and 100 nm; however, by no means should the trenches 50 extend below the hydrogen interface 43. According to one embodiment, a layer of photosensitive material, such as photoresist, is applied over the donor wafer 40, and is patterned to expose a selected portion of the donor wafer 40 which corresponds to the location of the trenches 50. The exposed portions of the donor wafer 40 are then anisotropically etched away, for example, using a reactive ion etching (RIE) process which uses, for example, a chlorine or hydrogen bromide/oxygen chemistry. After etching is performed, the donor wafer 40 is a patterned donor wafer 80 which includes the trench defined by sidewalls 54, 56 and a bottom surface 52 which corresponds to a surface of the donor wafer after etching.

As illustrated in FIG. 6, an oxide layer 60 is formed over the surface of the patterned donor wafer 80. The oxide layer 60 includes an upper portion 62, a lower portion 65 and sidewall portions 64, 66. The oxide layer 60 can be, for example, an oxide-based material such as silicon dioxide ($SiO_2$). The oxide layer 60 may be conformally blanket deposited overlying the surface of the patterned donor wafer 80, for example, using techniques such as by chemical vapor deposition (CVD) or physical vapor deposition (PVD) to a thickness between approximately 20 and 100 nm.

Figure 7:
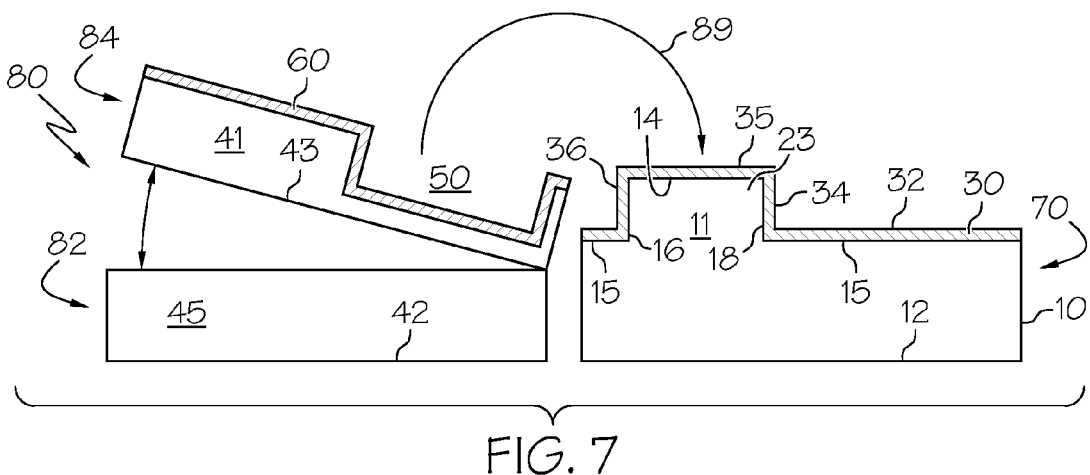
Figure 8:
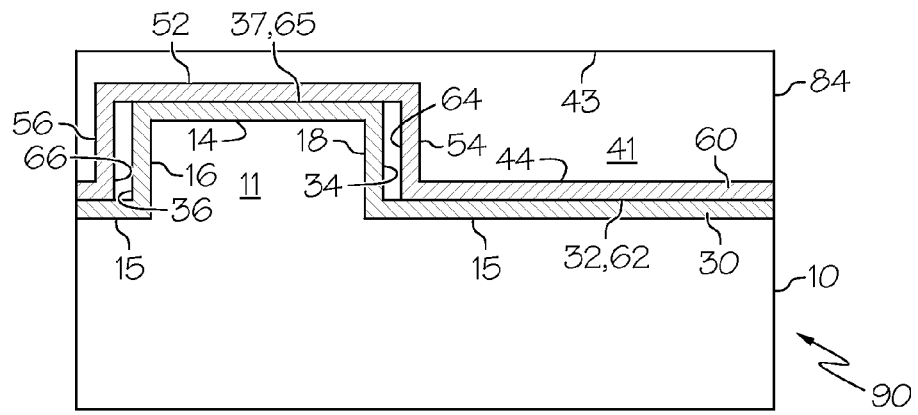
Figure 9:
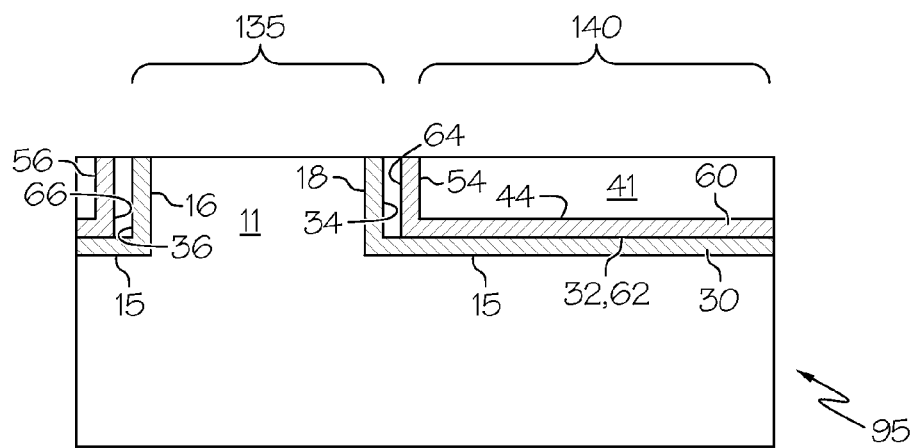

FIGS. 7 through 9 illustrate, in cross section, a differential semiconductor substrate 95 with a P-well region 11 and an N-well region 41 and method steps for its fabrication in accordance with various embodiments of the invention.

Once the patterned base wafer 70 and patterned donor wafer 80 have been prepared as illustrated in FIGS. 1 through 6, the transfer layer 41 is split from the carrier layer 45 along the hydrogen interface 43 so that the patterned donor wafer 80 is divided into a first portion 84 and a second portion 82. Once the transfer layer 41 has been split from the carrier layer 45, the transfer layer 41 is then transferred so that the transfer layer 41 can be attached to or mated with the patterned base wafer 70, as illustrated in FIG. 7 by the arced arrow 89. In another embodiment, the transfer layer 41 is split from the carrier layer 45 after the patterned donor wafer 80 (with the transfer layer 41 still attached) is attached to or mated with the patterned base wafer 70. In the example illustrated in FIG. 7, the transfer layer 41 is flipped upside down or inverted, aligned over the patterned base wafer 70 so that the trenches 50 of the transfer layer 41 are substantially aligned to mate with the mesa structure 23 of the patterned base wafer 70, and so that the mesa structure 41 is substantially aligned to mate with trench regions 21, 22 of the patterned base wafer 70.

As illustrated in FIG. 8, the transfer layer 41 is then brought into mating contact with the patterned base wafer 70. At this point, the upper portion 62 of oxide layer 60 is in contact with the lower portion 32 of the oxide layer 35, the lower portion 65 of oxide layer 60 is in contact with the upper portion 37 of the oxide layer 35, and the sidewall portions 64, 66 of oxide layer 60 are adjacent or in contact with the sidewall portions 34, 36 of the oxide layer 35, respectively. The resulting composite structure 90 formed by the assembly of the transfer layer 41 and the patterned base wafer 70 is then exposed to high temperatures (e.g., 1000° C. or more) to cause bonding of the oxide layer 30 of the patterned base wafer 70 and the oxide layer 60 of transfer layer 41 and thereby form a bonded composite structure 90. At this stage, the bonded composite structure 90 includes silicon regions 11, 41 having different crystallographic orientations.

As illustrated in FIG. 9, the bonded composite structure 90 is polished using, for example, a chemical mechanical polishing (CMP) process to remove the lower surface 43 of the transfer layer 41, the lower portion 65 of the oxide layer 60, and the upper portion 37 of the oxide layer 35. Removing these portions of the bonded composite structure 90 exposes silicon regions 11, 41 having different crystallographic orientations to provide the differential semiconductor substrate 95.

The differential semiconductor substrate 95 includes a first device region 135 and a second device region 140. In one embodiment, the first device region 135 includes a silicon region 11 which has a (100) crystallographic orientation and which can be used for forming NMOSFET-type devices, and the second device region 140 includes a silicon region 41 which has a (011) crystallographic orientation and which can be used for forming PMOSFET-type devices. In an alternative embodiment, the first device region 135 includes a silicon region 11 which has a (011) crystallographic orientation which can be used for forming PMOSFET-type devices, and the second device region 140 includes a silicon region 41 which has a (100) crystallographic orientation and can be used for forming NMOSFET-type devices Thus, the differential semiconductor substrate 95 can provide a starting substrate for fabricating differentially oriented CMOS devices while avoiding selective epitaxial processing required by conventional techniques. The differential semiconductor substrate 95 does not suffer from problems such as a high density of crystal defects and poor surface quality which are associated with conventional techniques that employ selective epitaxial growth differential substrates. Moreover, because the method of FIGS. 1-9 utilizes bulk silicon wafers and conventional processing techniques, the crystal quality and the surface quality of the differential semiconductor substrate 95 should be at least as good as the quality obtained using standard SOI substrates.

FIGS. 10-13 illustrate, in cross section, a CMOS device 150 fabricated in and on the differential semiconductor substrate 95 of FIG. 9 and method steps for its fabrication in accordance with various embodiments of the invention. In these illustrative embodiments the exemplary CMOS device 150 comprises NMOSFET device 160 and PMOSFET device 170 as will be explained below. Those of skill in the art will understand that CMOS device 150 is likely to be one of a large number of such devices that are interconnected in an integrated circuit.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over the differential semiconductor substrate 95 illustrated above with respect to FIG. 9.

Figure 10:
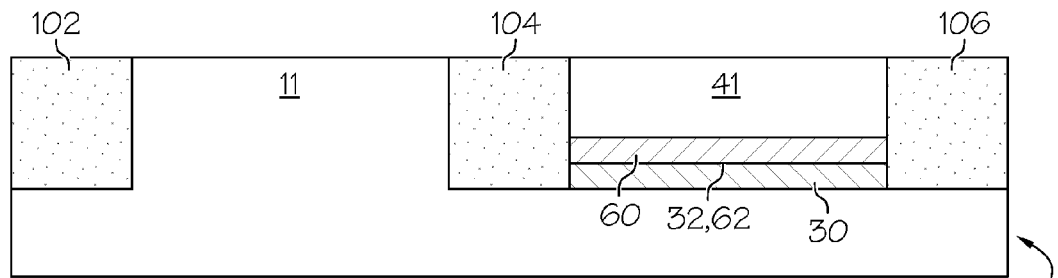
FIGS. 10-13 illustrate, in cross section, a CMOS device fabricated in and on the differential semiconductor substrate of FIG. 9 and method steps for its fabrication in accordance with various embodiments of the invention.

Although not illustrated in FIG. 10, in one embodiment, where the first device region 135 is for forming NMOSFET-type devices and the second device region 140 is for forming PMOSFET-type devices, the silicon region 11 is impurity doped to form a P-well region 11 and silicon region 41 is impurity doped to form an N-well region 41. For example, at least a surface portion of the silicon region 11 can be impurity doped with P-type conductivity determining impurities to form a P-well region 11. Impurity doping can take place, for example, by the implantation and subsequent thermal annealing of dopant ions such as boron. Similarly, at least a surface portion of the silicon region 41 can optionally be impurity doped with N-type conductivity determining impurities to form a N-well region 41. Impurity doping can take place, for example, by the implantation and subsequent thermal annealing of dopant ions such as phosphorus and arsenic. In an alternative embodiment, where the first device region 135 is for forming PMOSFET-type devices and the second device region 140 is for forming NMOSFET-type devices, the silicon region 11 is impurity doped to form an N-well region 11, and silicon region 41 is impurity doped to form a P-well region 41.

In addition, an optional protective oxide layer (not shown) can be deposited over the differential semiconductor substrate 95 to protect the differential semiconductor substrate 95 from damage and to help control implantation depth during subsequent implantation steps. In one embodiment, the protective oxide layer (not shown) can be, for example, a silicon dioxide layer, which preferably has a thickness of about 10-20 nm.

As illustrated in FIG. 10, dielectric isolation regions 102, 104, 106 can be formed in the differential semiconductor substrate 95. The dielectric isolation regions 102, 104, 106 electrically isolate adjacent MOSFET devices from one another and are formed to replace portions of the oxide layers 35, 60. For example, the NMOSFET device 160 can be electrically isolated from the PMOSFET device 170 and other MOSFET devices (not shown) by a dielectric isolation region 102, 104. There are many processes that can be used to form the dielectric isolation regions 102, 104, 106, so the process need not be described here in detail. For instance, in one embodiment, a shallow trench isolation (STI) process can be used in which shallow trenches are etched into the surface of the differential semiconductor substrate 95, and subsequently filled with an insulating material, such as an oxide material including silicon dioxide. After the trench is filled with an insulating material, the surface is usually planarized, for example, by chemical mechanical planarization (CMP) to form shallow trench isolation (STI) regions.

A layer of gate insulating material 131 is formed at the surface of differential semiconductor substrate 95. The layer of gate insulating material can be a layer of thermally grown silicon dioxide or, alternatively, a deposited insulator such as silicon oxide, silicon nitride, or a high dielectric constant (κ) insulator material having a high dielectric constant (K) relative to silicon dioxide. Examples of "high-κ dielectric" materials include hafnium and zirconium silicates, and their oxides, including, but not limited to, hafnium oxide ($HfO_2$), hafnium silicate (HfSiO), or the like. Deposited insulators can be deposited, for example, by chemical vapor deposition (CVD), low pressure chemical vapor deposition (LPCVD), or plasma enhanced chemical vapor deposition (PECVD). High dielectric constant (K) insulator materials are typically deposited using atomic layer deposition (ALD). The gate insulator layer preferably has a thickness of about 1-10 nm, although the actual thickness can be determined based on the circuit being implemented.

Figure 11:
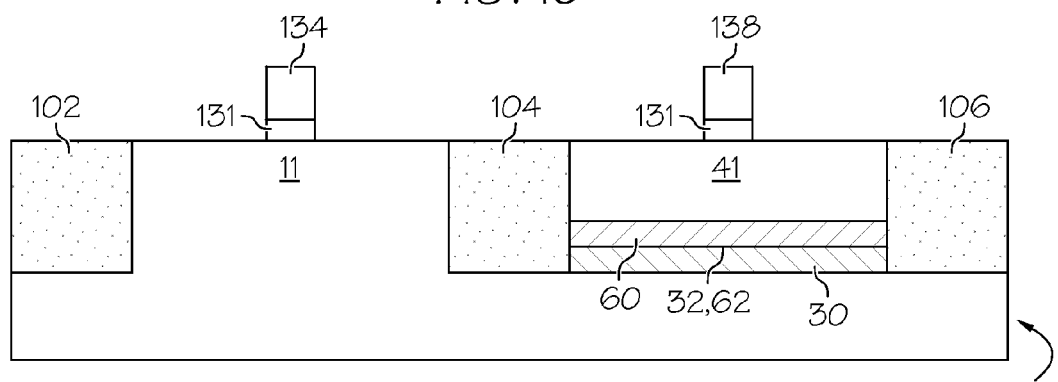

Gate electrodes 134, 138 can be formed by depositing, patterning, and etching a layer of metal or polycrystalline silicon, preferably a layer of undoped polycrystalline silicon. As illustrated in FIG. 11, the gate electrodes 134, 138 are formed over the P-well region 11 and the N-well region 41, respectively, in differential semiconductor substrate 95 and generally have a thickness or height of about 100-300 nm. In one embodiment, the gate electrode structures 131/134, 131/138 have a height of approximately 100 nm, and a width of approximately 40 nm or less. The polycrystalline silicon can be deposited, for example, by the reduction of silane ($SiH_4$) in a CVD reaction such as a low pressure chemical vapor deposition (LPCVD).

Figure 12:
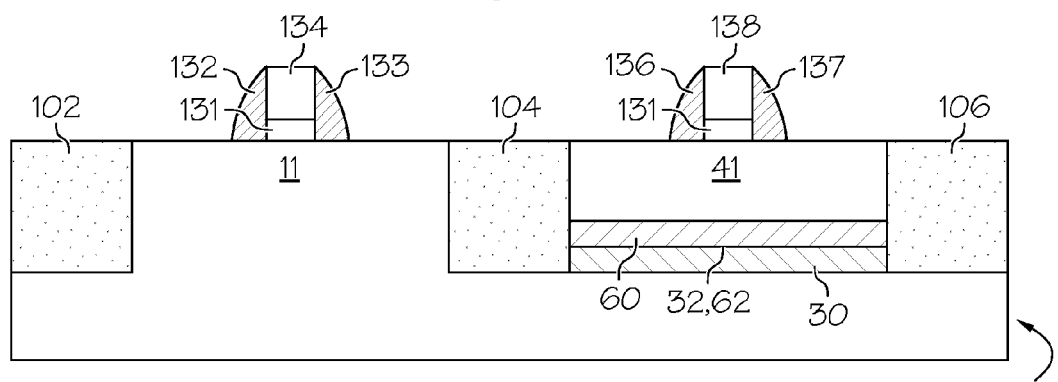

As illustrated in FIG. 12, sidewall spacers 132, 133 are formed on the sidewalls of gate electrode 134, and sidewall spacers 136, 137 are formed on the sidewalls of gate electrode 138. The sidewall spacers 132, 133, 136, 137 are formed by depositing a layer of insulating material such as silicon oxide and/or silicon nitride and subsequently anisotropically etching the insulating layer, for example by reactive ion etching (RIE). Silicon oxide and silicon nitride can be etched, for example, in a $CHF_3$, $CF_4$, or $SF_6$ chemistry.

A layer of masking material (not shown), which can be, for example, a layer of photoresist, is applied and patterned to cover the NMOSFET device 160 and to expose the PMOSFET device 170. This layer of patterned mask material is used as an ion implantation mask, and P-type conductivity determining impurities, such as boron ions, are implanted into the N-well portion 41 to form P-type source and drain regions 126, 128, and into gate electrode 138 to conductivity dope gate electrode 138 with P-type conductivity determining impurities, as illustrated in FIG. 13.

The patterned layer of masking material is removed and another layer of masking material, such as a layer of photoresist, is applied and is patterned to mask the PMOSFET device 170 and to expose NMOSFET device 160. This layer of patterned mask material is used as an ion implantation mask, and N-type conductivity determining impurities, such as phosphorus or arsenic ions, are implanted into the P-well portion 11 to form N-type source and drain regions 122, 124, and into the gate electrode 134 to conductivity dope gate electrode 134 with N-type conductivity determining impurities, as illustrated in FIG. 13.

For each of the transistor structures, the ion-implanted source and drain regions are self aligned with the gate electrodes. It will be appreciated by those skilled in the art that the order of forming the source and drain regions of the NMOSFET device 160 and the PMOSFET device 170 can be reversed.

Figure 13:
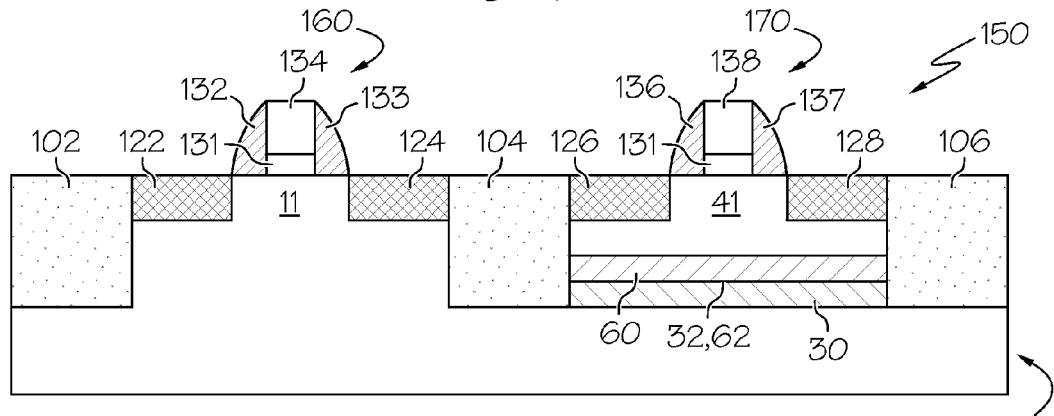

At the stage of processing shown in FIG. 13, the CMOS device 150 comprises the NMOSFET device 160 and the PMOSFET device 170. The NMOSFET device 160 comprises active S/D regions 122, 124 fabricated in the P-well region 11 and a gate electrode structure 131/134 fabricated on the P-well region 11 which has a (100) crystallographic orientation. The gate electrode structure 131/134 comprises a gate insulator layer 131 and a gate electrode 134 overlying the gate insulator layer 131. Sidewall spacers 132, 133 are adjacent a first sidewall and a second sidewall of the gate electrode 134. The PMOSFET device 160 comprises active S/D regions 126, 128 fabricated in the N-well region 41 and a gate electrode structure 131/138 fabricated on the N-well region 41 which has a (011) crystallographic orientation. The gate electrode structure 131/138 comprises a gate insulator layer 131 and a gate electrode 138 overlying the gate insulator layer 131. Sidewall spacers 136, 137 are adjacent a first sidewall and a second sidewall of the gate electrode 138. The differential crystallographic orientations of differential semiconductor substrate 95 can greatly enhance performance and greatly increase operational speed of the NMOSFET and PMOSFET devices 160, 170.

The CMOS device 150 illustrated in FIG. 11 can be completed by well-known steps (not illustrated) such as forming silicide regions at contact regions of the S/D regions 122, 124, 126, 128 and at contact regions of the gate electrodes 134, 138, depositing a layer of dielectric material, etching openings through the dielectric material, and forming metallization that extends through the openings to electrically contact the silicide contact regions of the S/D regions 122, 124, 126, 128 and gate electrodes 134, 138. Further layers of interlayer dielectric material, additional layers of interconnect metallization, and the like may also be applied and patterned to achieve the proper circuit function of the integrated circuit being implemented.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor device in and on a differential semiconductor substrate, comprising:
   providing a patterned base wafer comprising a first semiconductor region having a first crystallographic orientation;
   providing a patterned donor wafer comprising a second semiconductor region having a second crystallographic orientation different than the first crystallographic orientation; and
   forming a composite structure by attaching at least a portion of the patterned donor wafer comprising the second semiconductor region having the second crystallographic orientation different than the first crystallographic orientation to the patterned base wafer comprising the first semiconductor region having the first crystallographic orientation; and
   planarizing the composite structure to expose a surface of the differential semiconductor substrate comprising: the first semiconductor region having the first crystallographic orientation and the second semiconductor region having the second crystallographic orientation different than the first crystallographic orientation.

2. A method according to claim 1, further comprising the step of:
   bonding the portion of the patterned donor wafer to the patterned base wafer to form a bonded composite structure comprising the first semiconductor region and the second semiconductor region.

3. A method according to claim 1, wherein the patterned donor wafer comprises a carrier layer and a transfer layer delineated from the carrier layer by an interface, wherein the transfer layer comprises the second semiconductor region, and further comprising the step of:
   separating the transfer layer from the carrier layer along the interface so that the patterned donor wafer is divided into a first portion and a second portion, and wherein the step of attaching, comprises:
   attaching the transfer layer to the patterned base wafer to form the composite structure.

4. A method according to claim 3, wherein the step of providing a patterned base wafer comprises the steps of:
   providing a base wafer having the first crystallographic orientation, the base wafer comprising a lower surface and an upper surface;
   patterning the base wafer along the upper surface by etching at least one trench in the upper surface to define a mesa structure in the base wafer; and
   forming a first oxide layer overlying a surface of the patterned base wafer.

5. A method according to claim 4, wherein the step of providing a patterned donor wafer comprises the steps of:
   providing a donor wafer having the second crystallographic orientation, wherein the donor wafer comprises a lower surface, an upper surface, a transfer layer, a carrier layer, and an interface defined between the transfer layer and the carrier layer;
   etching a trench into a portion of the transfer layer to define the patterned donor wafer; and
   forming a second oxide layer overlying a surface of the patterned donor wafer.

6. A method according to claim 5, wherein the step of bonding comprises the step of:
   exposing the composite structure to a temperature adequate to cause bonding of the first oxide layer and the second oxide layer to form the bonded composite structure comprising the first semiconductor region and the second semiconductor region,
   wherein the step of planarizing comprises the step of:
   chemical mechanical polishing the bonded composite structure to remove a lower surface of the transfer layer, a lower portion of the oxide layer, and an upper portion of the oxide layer, and to expose the first semiconductor region having the first crystallographic orientation and the second semiconductor region having the second crystallographic orientation to form the differential semiconductor substrate; and
   wherein the step of attaching the transfer layer to the patterned base wafer to form a composite structure comprises the steps of:
   substantially aligning the trench of the transfer layer with the mesa structure of the patterned base wafer; and
   assembling the transfer layer to the patterned base wafer to form the composite structure by bringing the trench of the transfer layer into mating contact with the mesa structure of the patterned base wafer so that an upper surface of the oxide layer is substantially aligned to mate with the trench regions of the patterned base wafer.

7. A method according to claim 1, further comprising the step of:
   implanting dopant ions of a first conductivity type into the first semiconductor region to form a first well region of the first conductivity type;
   implanting dopant ions of a second conductivity type into the second semiconductor region to form a second well region of the second conductivity type; and
   forming a first gate structure overlying a portion of the first well region and a second gate structure overlying a portion of the second well region.

8. A method according to claim 7, further comprising the step of:
- implanting dopant ions of the first conductivity type into a portion of the first well region of the first conductivity type to form a first source region and a first drain region in the first well region of the differential semiconductor substrate;
- implanting second dopant ions of the second conductivity type into a portion of the second well region of the second conductivity type to form a second source region and a second drain region in the second well region of the differential semiconductor substrate.

9. A method according to claim 8, wherein the first crystallographic orientation is a (100) crystallographic orientation, wherein the second crystallographic orientation is a (011) crystallographic orientation, wherein the first well region is a P-well region and wherein the second well region is an N-well region.

10. A method according to claim 8, wherein the first crystallographic orientation is a (011) crystallographic orientation, wherein the second crystallographic orientation is a (100) crystallographic orientation, wherein the first well region is an N-well region and wherein the second well region is a P-well region.

11. A method for fabricating a differential semiconductor substrate, comprising:
- providing a first structure comprising: a first semiconductor substrate including a first semiconductor region, and a first oxide layer overlying a surface of the first semiconductor substrate, wherein the first semiconductor substrate has a first crystallographic orientation;
- providing a second structure comprising: a second semiconductor substrate comprising a first layer and a second layer, and a second oxide layer which overlies a surface of the first layer, wherein the second semiconductor substrate has a second crystallographic orientation different than the first crystallographic orientation, and wherein the first layer includes a second semiconductor region;
- removing the first layer and the second oxide layer from the second structure;
- assembling the first layer to the first semiconductor substrate to form a composite structure;
- exposing the composite structure to a temperature adequate to cause bonding of the first oxide layer and the second oxide layer to form a bonded composite structure; and
- planarizing the bonded composite structure to expose a surface of the differential semiconductor substrate comprising: the first semiconductor region having the first crystallographic orientation and the second semiconductor region having the second crystallographic orientation.

12. A method according to claim 11, wherein the second structure further comprises: an interface defined between the first layer and the second layer, and wherein the step of removing the first layer and the second oxide layer from the second structure, comprises:
- separating the first layer of the second semiconductor substrate from the second layer of the second semiconductor substrate along the interface.

13. A method according to claim 12, wherein the first semiconductor substrate includes a mesa structure which defines the first semiconductor region, and wherein the wherein the first layer has a trench formed therein, and further comprising the step of:
- substantially aligning the trench of the first layer with the mesa structure of the first semiconductor substrate.

14. A method according to claim 13, wherein the step of assembling the first layer to the first structure, comprises:
- bringing the trench of the first layer into mating contact with the mesa structure of the first semiconductor substrate to form the composite structure.

15. A method according to claim 14, wherein the step of planarizing the bonded composite structure, comprises:
- chemical mechanical polishing the bonded composite structure to remove a lower surface of the first layer, a lower portion of the second oxide layer, and an upper portion of the first oxide layer, and to expose the first semiconductor region having the first crystallographic orientation and the second semiconductor region having the second crystallographic orientation to form the differential semiconductor substrate.

16. A method according to claim 11, wherein the first crystallographic orientation is a (100) crystallographic orientation, wherein the second crystallographic orientation is a (011) crystallographic orientation, wherein the first semiconductor region is a P-well region and wherein the second semiconductor region is an N-well region.

17. A method according to claim 11, wherein the first crystallographic orientation is a (011) crystallographic orientation, wherein the second crystallographic orientation is a (100) crystallographic orientation, wherein the first semiconductor region is an N-well region and wherein the second semiconductor region is a P-well region.

18. A method for fabricating a differential semiconductor substrate, comprising:
- providing a structure comprising: a first semiconductor substrate including a first semiconductor region, wherein the first semiconductor substrate has a first crystallographic orientation; at least one oxide layer overlying a surface of the first semiconductor substrate; and a second semiconductor layer, wherein the second semiconductor layer has a second crystallographic orientation different than the first crystallographic orientation, and wherein the second semiconductor layer includes a second semiconductor region; and
- planarizing the structure to expose a surface of the differential semiconductor substrate comprising: the first semiconductor region having the first crystallographic orientation and the second semiconductor region having the second crystallographic orientation.

19. A method according to claim 18, wherein the step of planarizing the structure, comprises:
- chemical mechanical polishing the structure to expose the first semiconductor region having the first crystallographic orientation and the second semiconductor region having the second crystallographic orientation.

* * * * *

UNITED STATES PATENT AND TRADEMARK OFFICE
CERTIFICATE OF CORRECTION

PATENT NO. : 7,432,174 B1
APPLICATION NO. : 11/693890
DATED : October 7, 2008
INVENTOR(S) : Igor Peidous It is certified that error appears in the above-identified patent and that said Letters Patent is hereby corrected as shown below:

In Claim 13, column 12, lines 4-5, delete "the wherein".

Signed and Sealed this

Second Day of December, 2008

JON W. DUDAS
*Director of the United States Patent and Trademark Office*